(12) United States Patent
Lee et al.

(10) Patent No.: US 8,264,249 B2
(45) Date of Patent: Sep. 11, 2012

(54) VERTICAL PROBE CARD

(75) Inventors: Wen-Tsung Lee, Pingjhen (TW); Kuan-Chun Tseng, Pingjhen (TW)

(73) Assignee: Chunghwa Precision Test Tech. Co., Ltd., Taoyuan County (TW)

( * ) Notice: Subject to any disclaimer, the term of this patent is extended or adjusted under 35 U.S.C. 154(b) by 453 days.

(21) Appl. No.: 12/534,131

(22) Filed: Aug. 2, 2009

(65) Prior Publication Data
US 2011/0025357 A1    Feb. 3, 2011

(51) Int. Cl.
*G01R 31/00* (2006.01)
(52) U.S. Cl. .......... 324/756.03; 324/755.01; 324/755.09
(58) Field of Classification Search .................. None
See application file for complete search history.

(56) References Cited

U.S. PATENT DOCUMENTS

| 4,471,298 | A  | * | 9/1984 | Frohlich | 324/72.5 |
| 2006/0194331 | A1 | * | 8/2006 | Pamula et al. | 436/150 |
| 2007/0126123 | A1 | * | 6/2007 | Sawachi | 257/777 |
| 2008/0100291 | A1 | * | 5/2008 | Mayder | 324/254 |

* cited by examiner

*Primary Examiner* — Minh H Tang
(74) *Attorney, Agent, or Firm* — Li & Cai Intellectual Property (USA) Office

(57) ABSTRACT

The present invention provides on IC test substrate for testing various signals, a combined flexible and rigid PCB included in the structure is applicable to perform a mission including for example: stabilizing power input/output, signal transfer by a connector; general, power, and high frequency signal transmission in preserved integrity state.

13 Claims, 6 Drawing Sheets

VERTICAL PROBE CARD

BACKGROUND OF THE INVENTION

1. Field of the Invention

The present invention relates to a vertical probe card, and in particular, to a technique covering circuit design, structural arrangement and assembly regarding the vertical probe card.

2. Description of the Prior Art

Generally, wafer testing can be carried out using a vertical probe card. Its essential procedure is bonding the IC test substrate with a Probe PCB by soldering before test, and the test is performed after the packaging process because the bandwidth is limited for the vertical probe card. Result of test made as such causes low yield of packaging and high of production cost as well.

FIG. 1 is a schematic view of a conventional vertical probe card for integrated circuit (IC). As shown in FIG. 1, the vertical probe card 100 for IC comprises an IC test substrate 110 and a probe PCB 120 as two components. The way of general signal (including source signal) transmission is transmitting a signal 131 at the device under test (DUT) terminal to the direction of the test side by a probe contacting C4 pad 111. After passing a metal conductor 112 in the IC test substrate 110, the signal is transmitted to the probe PCB 120 by way of connecting the BGA pad 113 with a solder ball 140, then to a through hole 122, a metal conductor 123, another through hole 122 to a pogo pad 124 on the other surface. In this way the signal is transmitted into the test side to be deciphered. A high frequency signal 130 is also transmitted in this manner, but for avoiding a larger loss in the transferring interface, the signal is inputted into the test side through a connector 150.

Such a serial transmission passage is apt to be affected by the PCB of different materials and structural deference (for example: line width of trace, clearance, via size and depth of the through holes etc.). The above factors cause unmatching and discontinuity of impedance leading to return loss due to insertion loss and reflection. Such a phenomenon is more significant to the high frequency signal. For facilitating the signal to pass the through holes, it is necessary enlarge the cross sectional area of the through holes. Presently it can not be realized for the BGA package because its spacing is narrow. As the power source and signals take the same route, the area of the power line in the horizontal direction can be widened as broad as possible so as to carry the current with reduced inductance. But transmission in the vertical direction is limited by the diameter of the through holes. The inductance is increased, and will give rise to a simultaneous switch noise (SSN) and an excessive source target impedance.

Accordingly, the idea of improvement is directed to maintaining perfection of the signal transmission, this can be achieved through reconstruction of the passage and the scheme of the signal transmission so as to reduce on route loss of the signal transmission. By connecting the selectively cooperative transmission elements, the insertion loss problem can also be effectively improved. Besides, the reform of power source may contribute to improving manner and scheme of the signal transmission in the vertical direction. Combination of circuit design, production scheme and process through repeated experimentation, research and investigation will result in achieving integrity of power source and signals.

SUMMARY OF THE INVENTION

The object of the present invention is to provide circuit design of a vertical probe card. In the circuit design, the high frequency and the general signals are parted according to signal classification. Schematically the high frequency signal is transmitted outwardly via a flexible PCB with controlled impedance so as to prevent insertion loss during the high frequency signal passes through the PCB and the through holes. On the other hand, the power supply may be carried out by means of a large area copper foil so as to avoid insufficient input/output of current caused by flowing through a narrow passage (passing through the through holes in the vertical direction) thereby arising the problems of inadequate power source, unable to exclude SSN and too high target impedance. It is an appropriate solution to develop a technique for combining the flexible and rigid PCBs to produce the IC test substrate of the present invention thereby reliably applicable to test signals of the broader bandwidth.

To achieve the aforesaid object, many kinds of special production methods are selected to transmit the high frequency signals and improve the power source and also prevent discontinuance of the impedance when passing through through holes and refection the signals.

In testing the radio frequency, design and circuit matching can be done on the flexible PCB. The large area copper foil is provided on the flexible PCB. This can carry the source signal easily and make the power supply closer to DUT terminal so as to improve the power source. The source signal may directly be introduced from the flexible PCB to the DUT terminal. Therefore it is not necessary to build a source layer in the rigid board. With this scheme, the number of layers is reduced and production cost is curtailed as well.

Such an arrangement, design scheme and the fabrication method for signal transmission circuit of the IC test substrates differ quite far from the conventional ones, the present invention has several noteworthy advantages as follows:

1. Signals can be classified according to the scheme of signal transmission of the present invention.

2. The flexible PCB is selected for high frequency signal transmission in the present invention that contributes to solving the problem of preventing the discontinuance of the impedance when passing through the through holes thereby achieving better transmission efficiency.

3. The design scheme of the present invention also serves to attain the aim of preserving integrity of the signals.

In all, the scheme of the present invention is able to satisfy requirement of testing various signals including not only the common type of signals, but also the high frequency signals, and at the same time, ensuring the integrity of the power supply and practicability of the products.

BRIEF DESCRIPTION OF THE DRAWINGS

Other objects and purposes of the invention will be apparent to persons acquainted with scheme of the general type upon reading the following specification and inspection of the accompanying drawings.

DETAILED DESCRIPTION OF THE PREFERRED EMBODIMENTS

The present invention provides a scheme of a vertical probe card. The combination of flexible and rigid PCB is formed of multiple layers of flexible PCB and multiple layers of rigid PCB. On the multiple layer flexible PCB, the signal, power and ground circuits are formed, wherein signals are communicated with a plurality of transmission wires and a plurality of through holes, and DUT signals are transmitted from the flexible PCB to an external probe PCB. On the multiple layered rigid PCB, the signal, power and ground circuits are formed, and signals are communicated with a plurality of transmission wires and a plurality of through holes through the substrate. The DUT signals are transmitted to an external probe PCB via BGA surface too, while the test signals are conducted by the metal conductor and the through holes so as to perform signal transmission.

Figure 1:
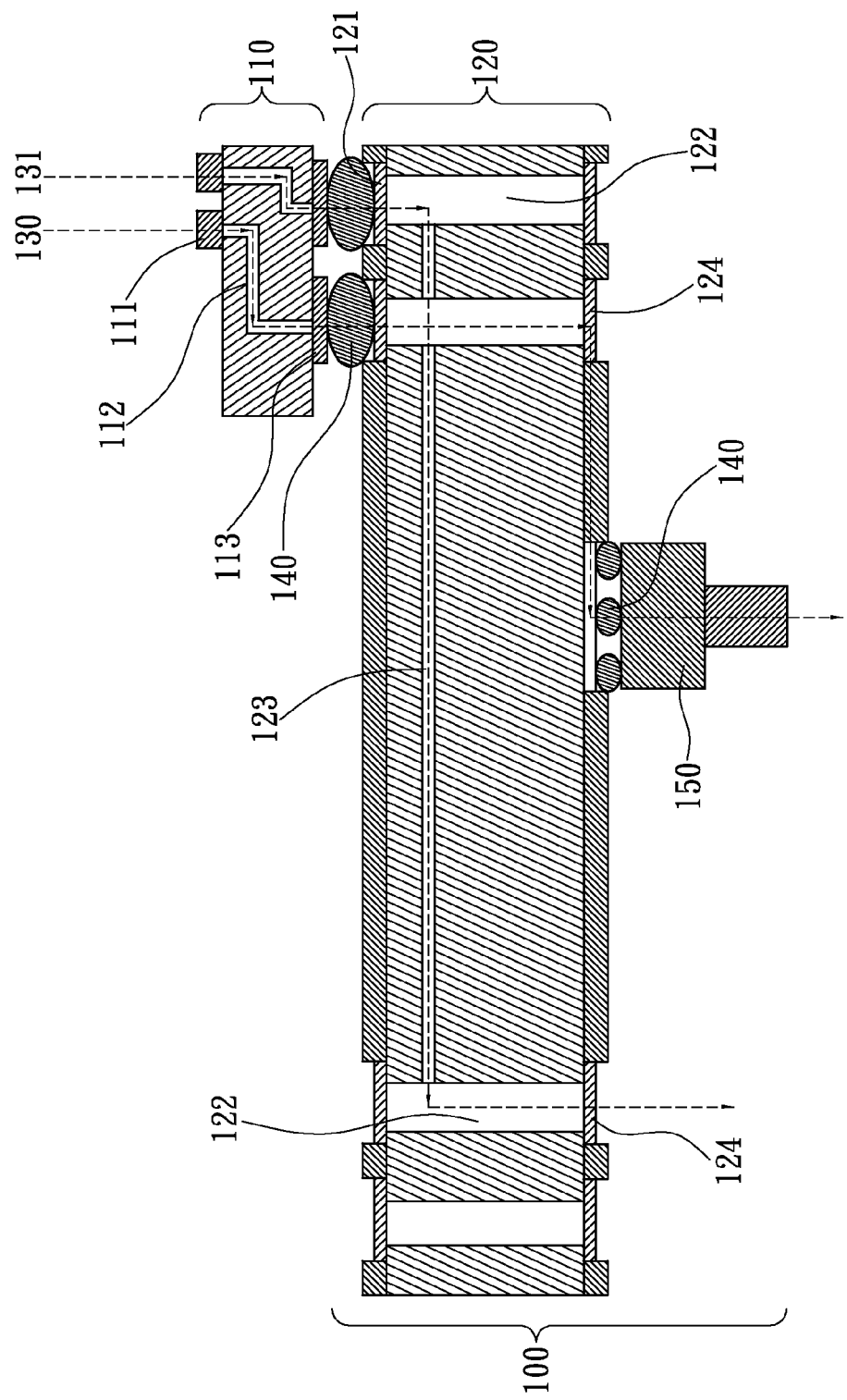
FIG. 1 is a cross sectional view of a conventional vertical probe card for IC.
Figure 2:
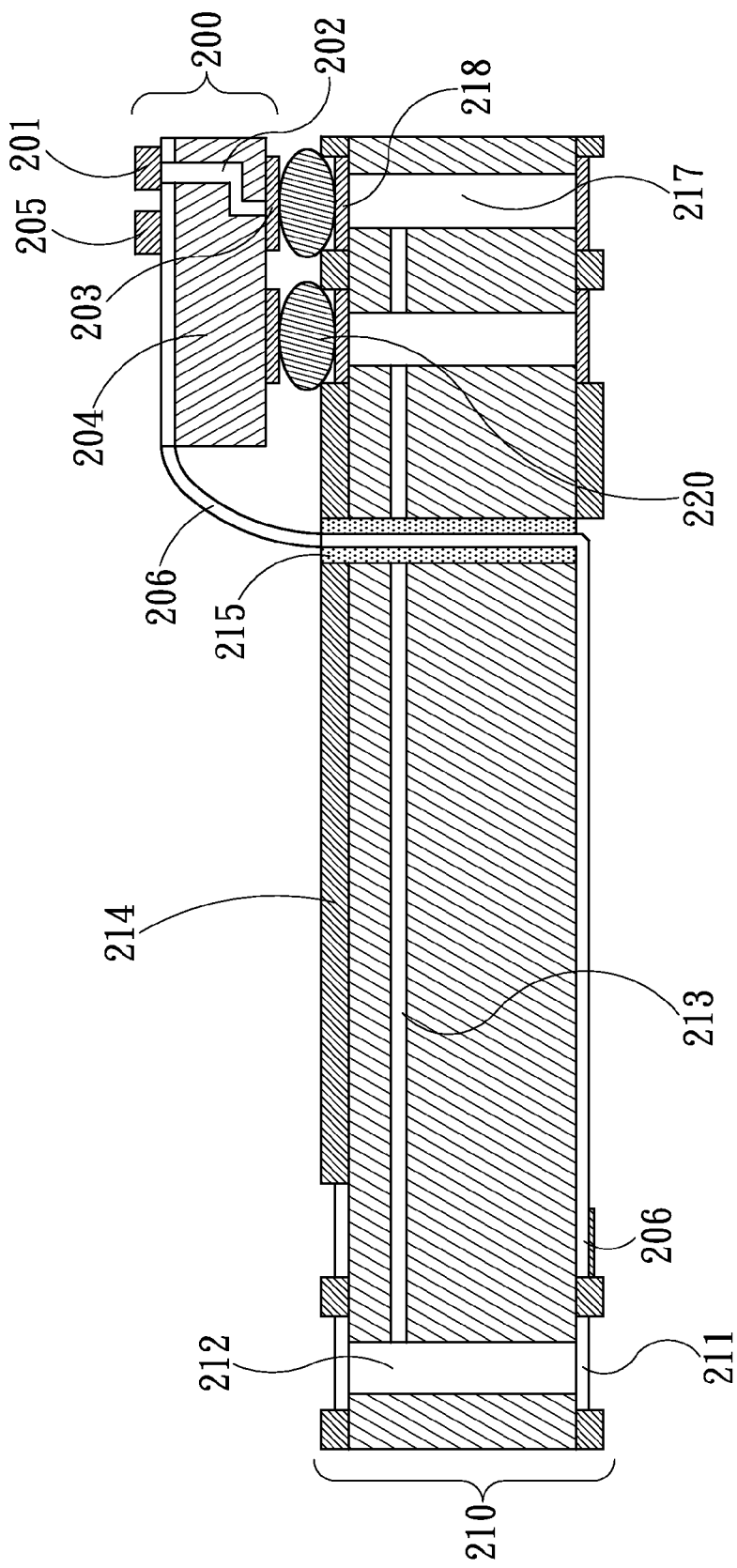
FIG. 2 is a cross sectional view of a vertical probe card with an improved power source signal.

Referring to FIG. 2, the combined flexible and rigid PCB is applicable in two respects. The first one is for improving the power integrity. The structure and usage for each part in the device is as follows: An IC test substrate 200 containing a plurality of probe contacting C4 pad 201, the signals are transmitted through an inner material of build up 204 of the IC test substrate 200 and a conductor 202, or C4 pad 205, whereas the transmission passages are divided into two routes, one for general signals and the other for power signals.

A signal of DUT wafer may be transmitted to the test side by connecting with the IC test substrate 200 or the probe PCB 210. On the other hand, the transmission of the general signals is performed by soldering the BGA pad 203 on the IC test substrate 200 to BGA pad 218 of the probe robe PCB. The soldering materials may be the solder ball or solder paste 220. A protective solder mask 214 can be applied to prevent the accidental short circuiting between two pads. By so, the signal at DUT terminal can be transmitted to the test side. The route will be from BGA pad 218 of the probe PCB 210, the BGA through hole 217, metal conductor 213, through hole 212 at pogo terminal to the pogo pad 211. The power signal can be transmitted by the flexible PCB 206 by way of the metal probe C4 pad 205. For shortening the transmission route, a slot 215 is formed on the probe PCB 210 so as to allow the flexible PCB 206 to pass through. Finally the pogo pad of the flexible PCB 206 is brought in contact with the pogo pin at test side to accomplish transmission.

Figure 3:
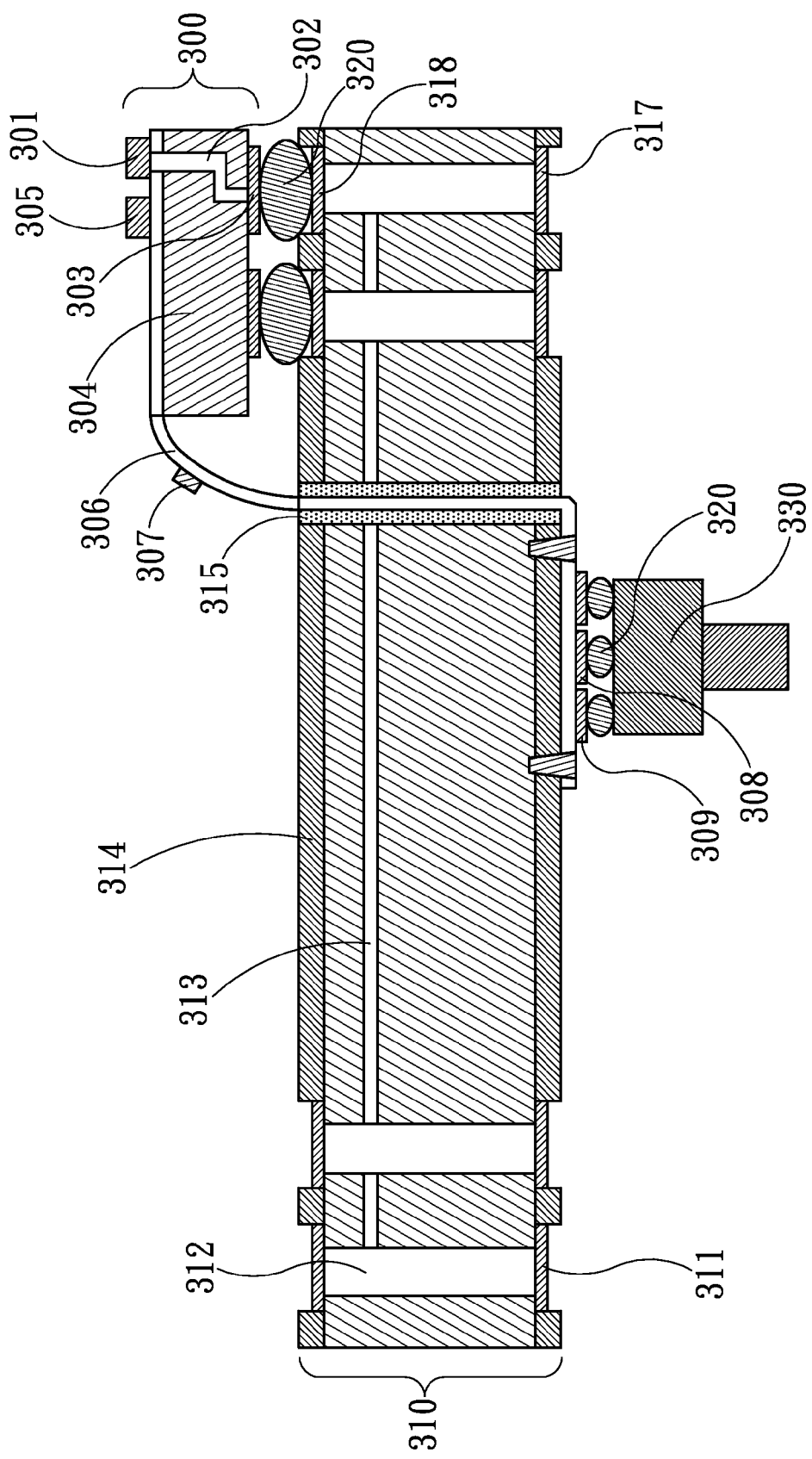
FIG. 3 is a cross sectional view of a vertical probe card for signal transmission

Referring to FIG. 3, it is for the second object to transmit high frequency signals. The structure and function of each part in the device are as follow: an IC test substrate 300 containing a plurality of probe contacting C4 pad 301, the signals are transmitted through an inner material 304 of the IC test substrate 300 and a conductor 302, or a flexible PCB 306, whereas the transmission passage are divided in two routes, one for general signals and the other for high frequency signals. The flexible PCB 306 has a first end portion, an extended portion, a penetrating portion, and a second end portion arranged in sequence.

A signal of DUT wafer may be transmitted to the test side by connection with the IC test substrate 300 or the probe PCB 310 having a first surface and an opposite second surface, wherein a slot 315 is formed in the probe PCB 310 and providing passage from the first surface to the second surface, while the transmission of the general signals is performed by soldering the BGA pad 303 on the IC test substrate 300 to a BGA pad 318 of the probe PCB 310 using the solder ball or solder paste 320, that is to say, the IC test substrate 300 is disposed on the first surface of the probe PCB 310. A protective solder-mask 314 can be applied to prevent accidental short circuiting between two pads. By so, the signal at DUT terminal can be transmitted to the test side via BGA pad 318 of the probe PCB 310, the BGA through hole 317, metal conductor 313, through hole 312 at pogo terminal and the pogo pad 311. For the high frequency signal, it can be transmitted by the flexible PCB 306 by way of the metal probe C4 pad 305, wherein the first end portion of the flexible PCB 306 is connected to the IC test substrate 300. For shortening the transmission route and reducing the card board loss, the slot 315 is formed on the probe PCB 310, so allows the flexible PCB 306 to pass through, that is to say, the penetrating portion passes through the slot 315 of the probe PCB 310, and the second end portion is exposed from the second surface of the probe PCB 310. Specifically, the second end portion of the flexible PCB 306 is disposed on the second surface of the probe PCB 310. Moreover, the penetrating portion of the flexible PCB 306 is perpendicular to the first surface and the second surface of the probe PCB 310. Soldering the metal pads at the terminal of the flexible PCB 306 including signal pad 308 and ground pad 309 with a connector 330 using solder ball or solder paste 320 so as to transmit the high frequency signals to the test side via this interface. That is to say, the flexible PCB 306 has the signal pad 308 and the ground pad 309 disposed on the second end portion thereof for connecting to the connector 330. The extended area space of the flexible PCB 306 may allow any necessary circuit to be disposed on with related electronic components 307, and specifically, an outer surface of the extended portion of the flexible PCB 306 provides an area for fixing an electronic component 307 thereon.

Figure 4A:
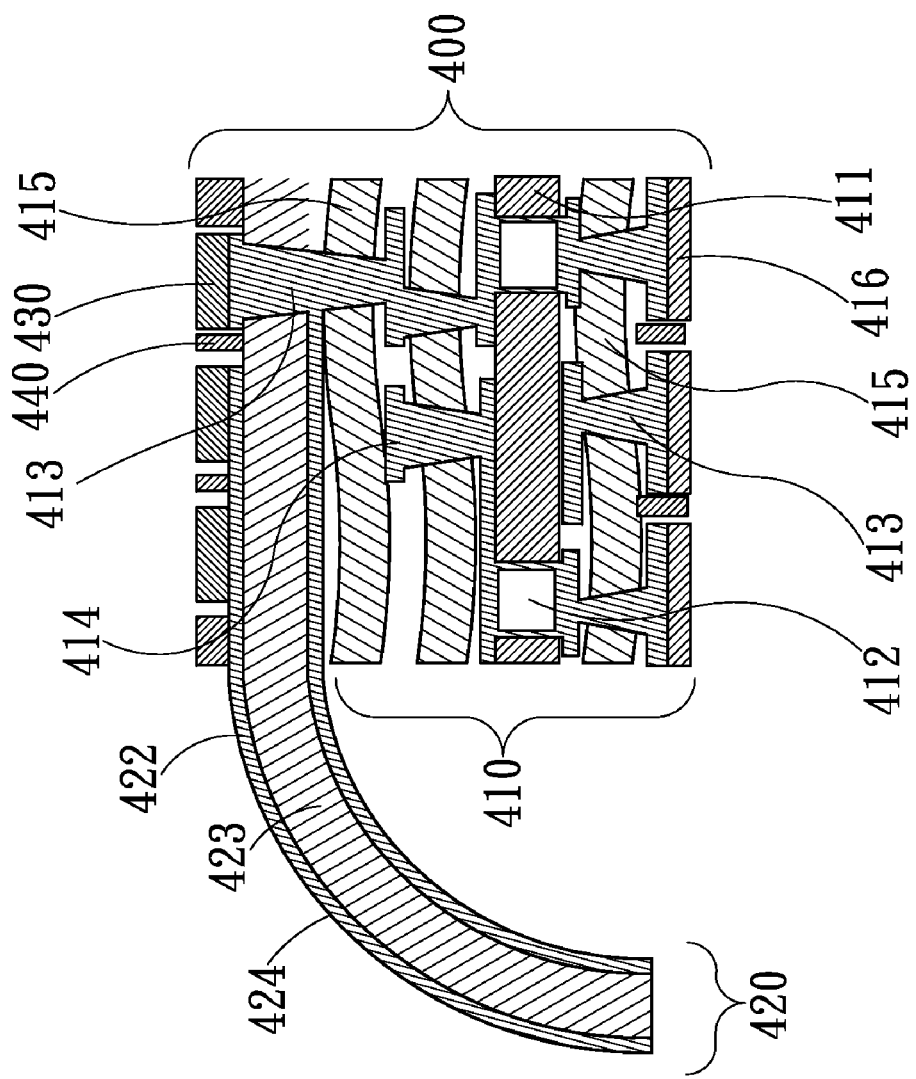
FIG. 4A to FIG. 4C are cross sectional views of a multifunctional vertical probe card.
Figure 4B:
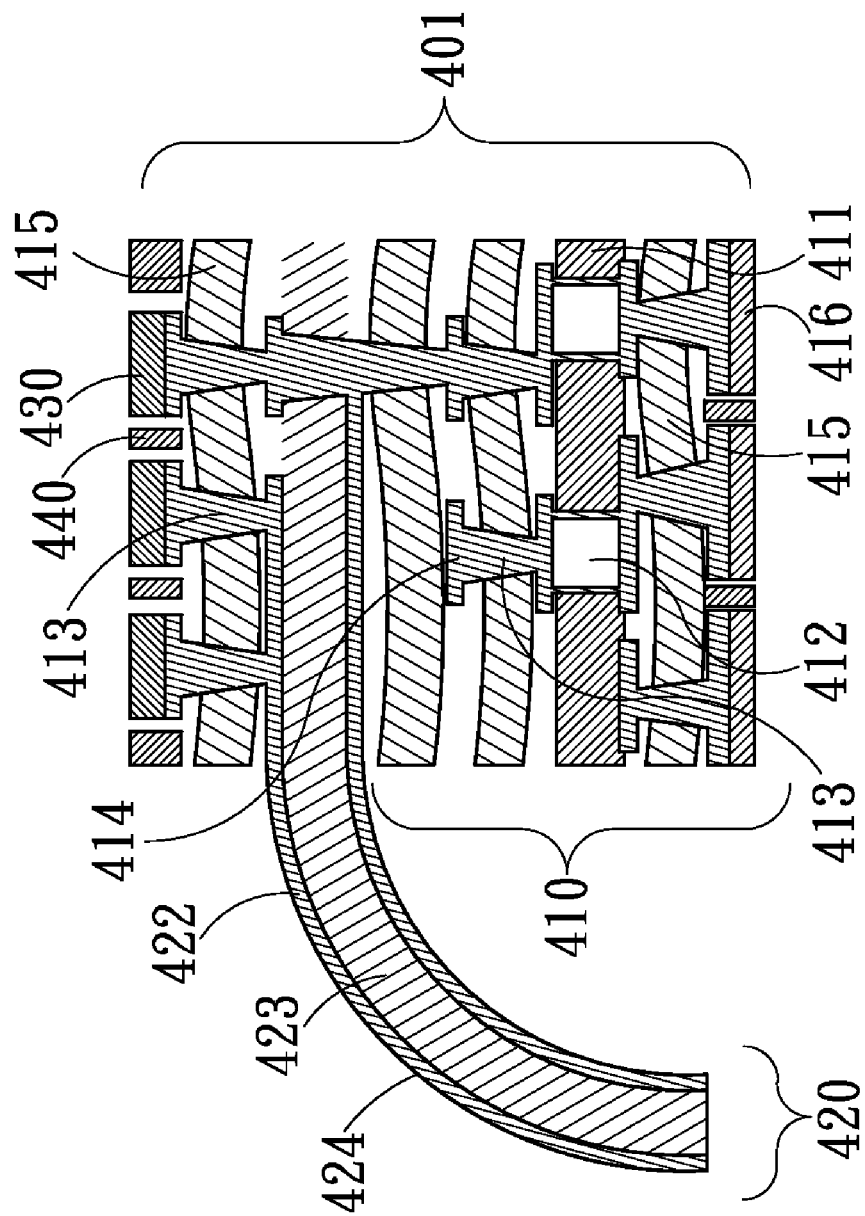
Figure 4C:
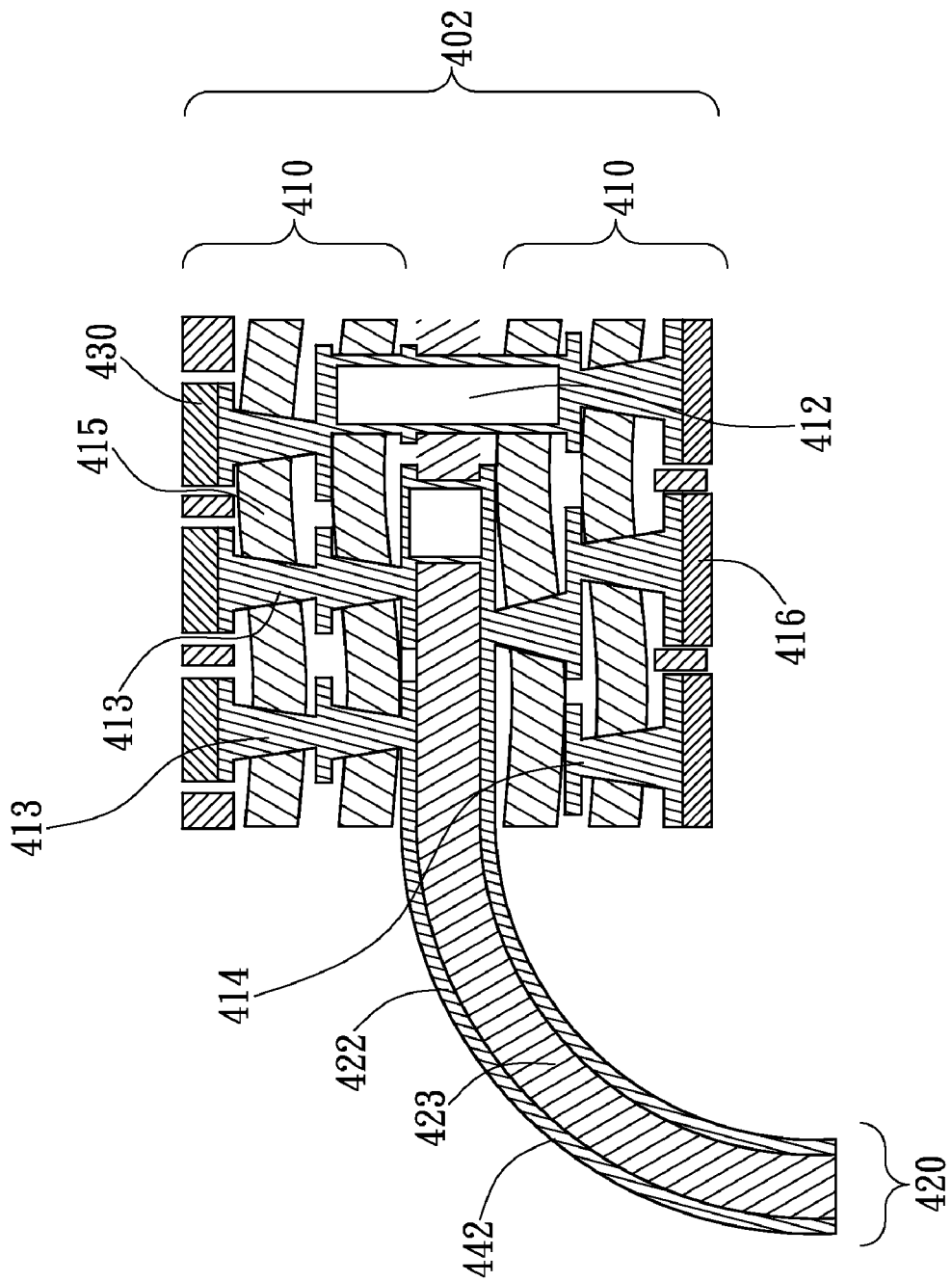

As shown in FIGS. 4A-4C, the structural scheme may be arranged on the flexible and rigid PCBs wherein the flexible PCB can be used as Rigid-Flex type I 400, Rigid-Flex type II 401, or directly as Rigid-Flex type III 402 as described below:

(1) The IC test substrate (hereinafter referred as the rigid PCB 410) comprises several fine lines, several blind vias and several micro drilled holes (for example, formed by mechanical drilling, laser drilling, electroplating, copper paste filling or resin filling). The rigid PCB 410 is at first prepared by drilling a through hole 412 on a copper clad laminate (CCL) 411 and then being electroplated. It is for serving to transmit the signals to the DUT terminal and the test side. Then the number of layers is increased by stacking with bonding films 415, and draw out a signal passage by forming blind via holes with laser beam treatment and filling the hole by electroplating. Finally fabricate a signal transmission passage and a bonding metal pad 414 by an image transfer process. The number of stacked layers is determined by actual requirement of circuit layout and the process is repeatedly carried out. The rigid PCB is constructed in plural layers wherein the signals (for example logic, digital, high frequency and power signals etc.) are transmitted through through holes and the metal conductor.

(2) The flexible PCB 420 is made of a soft copper foil substrate (FCCL) 420 whose material of the PI base 423 is polyimide enclosed with a copper foil layer capable of performing image transfer. Then a metal conductor 422 is formed for connecting signals, and a cover layer 424 is adhered on the upper surface so as to prevent the copper foil from being oxidized and keep the main body flexible. The number of layers for the flexible PCB depends on demand for actual circuit layout. The flexible PCB needs at least two layers, one is for signal use (for example, logic, digital, high frequency and power signals etc.), while the second is a ground plane. On the surface of DUT, there are plurality of probe contacting pads for the probe (for example, cobra needle, socket pin etc.) to contact, and at the same time, preparing a plurality of wafer patterns (multi DUT, DUT□1) on the contact layer of the probe so as to upgrade the test efficiency.

On the transmission passage of the flexible PCB, there may be provided a plurality of application circuits, enlarged area and region for circuit layout, and disposing a plurality of electronic components according to the needs of prepared application circuits so as to enlarge the field of test.

The flexible PCB has a part where being not pressed each other with the rigid PCB. This part can be remained as room for varying the scheme, and flexed randomly and bonded with the probe PCB. The terminal where it is bonded with the probe PCB can be directly mated to the test side with the connector. As for the flexible PCB, its surface to communicate with the signals may be at the DUT side or the test side. For assuring the security of the conductor from been severed when the board is bent, a cover layer is pressed externally onto the flexible PCB.

(3) The combination of the rigid and flexible PCB comprises several fine lines, several blind vias and several micro drilled holes (for example, formed by mechanical drilling, laser beam drilling, electroplating, copper paste filling or resin filling). Combining the semi-products made by items (1) and (2), and adhering a bonding film 415 there between. The signal transmission is achieved by repeating the laser drilling procedures for blind via 413; electroplating and filling holes. Finally image transfer is performed on the surface, and a probe contacting C4 pad 430 and a BGA pad 416 are made by electroplating. In order to prevent accidental short circuiting in the last soldering process of bonding the BGA side and the probe PCB, a solder-mask 440 may be applied as a barrier, at the same time it can serve to minimize danger of short circuiting in case repairing the probe contacting C4 pad 430 in the future. It is to be understood that application of the solder-mask 440 is optional according to the actual situation. Several wafer patterns (multi DUT□1) may be disposed on the probe pad so as to improve test efficiency. The utilization area (area□30 mm×30 mm) of the combined flexible and rigid PCB may be enlarged according to the user's demand. Provision of a plurality component parts, connectors and a plurality of IC probe contactors is possible with the spacing smaller than 200 μm (pitch ≦0.2 mm). The flexible and rigid PCBs are bonded by adhering an epoxy resin film there between under high pressure and high temperature. The contour of the product is modified with the forming machine. Part of the structure belongs to flexible PCB only must be completed through deep cutting with forming machine or laser trimming.

Combined flexible and rigid PCB has to go under process of the mechanical drilling or laser beam drilling to form a hole diameter □3 mil and further electroplated to achieve the signal transmission in the vertical direction. On the combined flexible and rigid PCB, the solder-mask may be optionally applied between the two probe contacting metal pads respectively formed on the wafer test surface and on the BGA at the tester side. The rigid PCB is composed of several fine lines, several blind vias, several micro drilled holes (for example formed by mechanical drilling, laser beam drilling, electroplating, copper paste filling or resin filling).

The application of aforesaid multi-purpose test substrate is as follow: On the DUT surface of the test substrate, several probe contacting metal pads are provided to transmit and receive DUT test signals. The high frequency or general signals are conducted into the flexible PCB or the electroplated blind vias and drilled holes via probe contacting metal pads, then transmitted to the probe PCB by the metal conductor formed on the flexible PCB but not necessary to pass through the substrate.

The power signal is conducted into the flexible PCB or through blind vias by way of the probe contacting metal pads, then to the probe PCB by the metal conductor formed on the flexible PCB, but the signal is not necessary to pass through the substrate. The area of the transmission traces is widened to provide a larger and more stable current output thereby improving the integrity of the power source.

The connector and soldering are used to connect the flexible PCB with the P probe PCB so that the transmission of the signals of high frequency, general and power source becomes possible.

The present invention provides the technique of testing general and high frequency signals on the IC test substrate. It is also able to fulfill the demand of assuring integrity of the power. For assuring impedance matching, the test can be carried out on the flexible PCB.

The characteristics of the signal arrangement, structural design, and fabrication technique of the present invention embodied in the field of testing various signals are described above. It is to be understood that those who are skilled in the art will readily perceive how to modify the invention. Therefore the scope of the invention is indicated by the appended claims rather than by the foregoing description and all changes which come within the meaning and range of equivalency of the claims are intended to be embraced therein.

What is claimed is:

1. A vertical probe card, comprising:
a probe printed circuit board (PCB) having a first surface and an opposite second surface,
wherein a slot is formed in the probe PCB providing passage from the first surface to the second surface;
an integrated circuit (IC) test substrate disposed on the first surface of the probe PCB; and
a flexible PCB having a first end portion, an extended portion, a penetrating portion, and a second end portion arranged in sequence,
wherein the first end portion is connected to the IC test substrate, the penetrating portion passes through the slot of the probe PCB, and the second end portion is exposed from the second surface of the probe PCB.

2. The vertical probe card of claim 1, wherein the extended portion of the flexible PCB provides an area for fixing an electronic component thereon.

3. The vertical probe card of claim 1, wherein the second end portion of the flexible PCB is disposed on the second surface of the probe PCB.

4. The vertical probe card of claim 3, wherein the flexible PCB has at least one signal pad and at least one ground pad disposed on the second end portion thereof.

5. The vertical probe card of claim 1, wherein one surface of the IC test substrate is disposed on the first surface of the probe PCB, and the first end portion of the flexible PCB is disposed on the other surface of the IC test substrate.

6. The vertical probe card of claim 5, wherein the flexible PCB has at least one pad disposed on and exposed from the first end portion thereof.

7. The vertical probe card of claim 1, wherein the first end portion of the flexible PCB is embedded in the IC test substrate.

8. The vertical probe card of claim 7, wherein the IC test substrate has at least one pad electrically connected to the first end portion of the flexible PCB.

9. The vertical probe card of claim 1, wherein the penetrating portion of the flexible PCB is perpendicular to the first surface and the second surface of the probe PCB.

10. The vertical probe card of claim 1, wherein at least one through hole is formed in the probe PCB and electrically connected to the IC test substrate for providing signal transmission from the IC test substrate to the second surface of the probe PCB.

11. The vertical probe card of claim 10, wherein the through hole is perpendicular to the first surface and the second surface.

12. The vertical probe card of claim 1, wherein an outer surface of the extended portion of the flexible PCB provides an area for fixing an electronic component thereon.

13. The vertical probe card of claim 1, wherein the probe PCB has at least one pogo pad disposed on the second surface thereof, and an end edge of the second end portion of the flexible PCB is disposed adjacent to the pogo pad.

* * * * *